United States Patent
Bichler et al.

(10) Patent No.: US 9,396,431 B2
(45) Date of Patent: Jul. 19, 2016

(54) NETWORK OF ARTIFICIAL NEURONS BASED ON COMPLEMENTARY MEMRISTIVE DEVICES

(75) Inventors: Olivier Bichler, Massy (FR); Barbara Desalvo, Montbonnot Saint-Martin (FR); Christian Gamrat, Les Ulis (FR); Manan Suri, New Delhi (IN)

(73) Assignee: Commissariat A L'Energie Atomique et aux Energies Alternatives, Paris (FR)

(*) Notice: Subject to any disclaimer, the term of this patent is extended or adjusted under 35 U.S.C. 154(b) by 221 days.

(21) Appl. No.: 14/126,410

(22) PCT Filed: Jun. 27, 2012

(86) PCT No.: PCT/EP2012/062422
§ 371 (c)(1),
(2), (4) Date: Dec. 13, 2013

(87) PCT Pub. No.: WO2013/000940
PCT Pub. Date: Jan. 3, 2013

(65) Prior Publication Data
US 2014/0122402 A1 May 1, 2014

(30) Foreign Application Priority Data

Jun. 30, 2011 (FR) .................................. 11 55859

(51) Int. Cl.
*G06N 3/063* (2006.01)
*G06N 3/04* (2006.01)
*G06N 3/08* (2006.01)
*G11C 11/54* (2006.01)
*G11C 13/00* (2006.01)

(52) U.S. Cl.
CPC .................. *G06N 3/04* (2013.01); *G06N 3/063* (2013.01); *G06N 3/0635* (2013.01); *G06N 3/08* (2013.01); *G11C 11/54* (2013.01); *G11C 13/0007* (2013.01)

(58) Field of Classification Search
None
See application file for complete search history.

(56) References Cited

U.S. PATENT DOCUMENTS

| | | | | |
|---|---|---|---|---|
| 8,832,009 | B2 * | 9/2014 | Rose | G06N 3/0635 706/15 |
| 2010/0299296 | A1 | 11/2010 | Modha et al. | |
| 2010/0299297 | A1 | 11/2010 | Breitwisch et al. | |
| 2011/0106742 | A1 * | 5/2011 | Pino | G06N 3/0635 706/33 |

(Continued)

FOREIGN PATENT DOCUMENTS

FR 2919410 A1 1/2009

OTHER PUBLICATIONS

Kim, Hyongsuk, et al. "Neural synaptic weighting with a pulse-based memristor circuit." *Circuits and Systems I: Regular Papers, IEEE Transactions on* 59.1 (2012): 148-158.*

(Continued)

*Primary Examiner* — Stanley K Hill
*Assistant Examiner* — David H Kim
(74) *Attorney, Agent, or Firm* — Baker & Hostetler LLP

(57) ABSTRACT

A neural network comprises a plurality of artificial neurons and a plurality of artificial synapses each input neuron being connected to each output neuron by way of an artificial synapse, the network being characterized in that each synapse consists of a first memristive device connected to a first input of an output neuron and of a second memristive device, mounted in opposition to said first device and connected to a second, complemented, input of said output neuron so that said output neuron integrates the difference between the currents originating from the first and second devices.

14 Claims, 9 Drawing Sheets

(56) References Cited

U.S. PATENT DOCUMENTS

| | | | |
|---|---|---|---|
| 2011/0119214 A1* | 5/2011 | Breitwisch | G06N 3/0635 706/33 |
| 2012/0011088 A1* | 1/2012 | Aparin | G06N 3/0635 706/25 |
| 2012/0011090 A1* | 1/2012 | Tang | G06N 3/0635 706/33 |
| 2012/0011091 A1* | 1/2012 | Aparin | G06N 3/0635 706/33 |
| 2012/0011093 A1* | 1/2012 | Aparin | G06N 3/0472 706/33 |

OTHER PUBLICATIONS

M. He et al., "Mixed Analog-Digital Design of a Learning Nano-Circuit for Neuronal Architectures", Design and Technology of Integrated Systems in Nanoscale ERA, Mar. 2008, p. 1-5.

D. Chabi et al., "Robust Neural Logic Block (NLB) based on Memristor Crossbar Array", IEEE ACM International Syposium on Nanoscale Architectures, 2011, pp. 137-143.

M. Suri et al., "Phase Change Memory as Synapse for Ultra-Dense Neuromorphic Systems: Application to Complex Visual Pattern Extraction", Electronic Devices Meeting, IEEE Dec. 2011, 4 pages.

International Search Report dated Nov. 8, 2012, for International Patent Application No. PCT/EP2012/062422.

* cited by examiner

NETWORK OF ARTIFICIAL NEURONS BASED ON COMPLEMENTARY MEMRISTIVE DEVICES

CROSS-REFERENCE TO RELATED APPLICATIONS

This application is a National Stage of International patent application PCT/EP2012/062422, filed on Jun. 27, 2012, which claims priority to foreign French patent application No. FR 1155859, filed on Jun. 30, 2011, the disclosures of which are incorporated by reference in their entirety.

FIELD OF THE INVENTION

The invention relates to the field of artificial neural networks and more particularly to spiking neural networks. These networks are schematically inspired by the biological neural networks whose operation they imitate.

The invention also relates to the implementation of artificial neural networks in the form of electronic circuits designed with the aid of memristive devices. In particular, the invention relates to memristive devices of PCM ("Phase-Change Memory") type which are suited to the production of artificial synapses but whose conductance varies in a progressive manner only in a single direction (increase or decrease).

The invention also relates to the field of unsupervised learning methods implemented by an artificial neural network, that is to say the automatic learning methods allowing the extraction of knowledge organized on the basis of real or simulated data. The data considered to be the most similar are assembled into one and the same group whilst the data considered to be different are distributed into distinct groups.

BACKGROUND

Artificial neural networks are composed essentially of neurons mutually interconnected by synapses, which are conventionally implemented by digital memories, but which can also be implemented by resistive components whose conductance varies as a function of the voltage applied across their terminals.

A learning rule conventionally used by spiking neural networks is the STDP ("Spike Timing Dependent Plasticity") rule. This is a biologically inspired rule whose objective is to reproduce the operation of the learning carried out by biological neurons and synapses. In order for such a rule to be implemented, the conductance of the synapses must vary as a function of the relative instants of arrival of the pre and post synaptic pulses transmitted by the neurons connected respectively at input and at output. According to the STDP rule, the conductance of a synapse is increased if its post synaptic neuron is activated after its pre synaptic neuron and decreased in the converse case. Furthermore, the variation in conductance also depends on the precise lag between the pulses that are generated subsequent to the activation of the neurons. Typically the more significant the lag, the less the conductance will vary.

To implement an STDP rule or any other unsupervised learning method, it is necessary for the conductance of the memristive components which model the artificial synapses of the network to be able to vary in a progressive manner, as a function of the voltage applied across their terminals, both in the increasing and the decreasing direction. Furthermore, it is desirable that this can be done without prior knowledge of the state of conductance of the synapse.

Components of PCM type do not satisfy this property while moreover exhibiting characteristics suited to the practical production of neural networks, in particular high integration density, fast changes of state and decreased consumption.

Patent applications US 2010/0299296 and US 2010/0299297 are known, which describe an implementation of the STDP rule on the basis of unipolar devices of PCM type. These applications teach an implementation of an artificial neural network associated with the STDP learning rule with unipolar memristive devices of PCM type. However, because it seeks to imitate the biological STDP function, the proposed method requires the implementation of complex programming signals, which furthermore do not take account of the absence of progressive decrease in the conductance, in relative value, of such a device.

SUMMARY OF THE INVENTION

The present invention is aimed at proposing an artificial neural network whose synapses can be produced on the basis of memristive components of PCM type and which is suited to the implementation of a learning rule utilizing the alternating increase and decrease in the conductance of the synapses as a function of the state of the neurons to which they are connected.

The subject of the invention is thus a neural network comprising a plurality of artificial neurons and a plurality of artificial synapses each input neuron being connected to each output neuron by way of an artificial synapse, said network being characterized in that each synapse consists of a first memristive device connected to a first input of an output neuron and of a second memristive device, mounted in opposition to said first device and connected to a second, complemented, input of said output neuron so that said output neuron integrates the difference between the currents originating from the first and second devices.

In a variant embodiment of the invention, said memristive devices are intended to receive a pre-synaptic pulse emitted by the input neuron to which they are connected upstream and/or a post-synaptic pulse emitted by the output neuron to which they are connected downstream, said pulses being configured so as to cause an increase, a decrease or a stagnation in the equivalent conductance of the synapse consisting of said devices, an increase in the equivalent conductance of the synapse being caused by an increase in the real conductance of the first device or a decrease in the real conductance of the second device and a decrease in the equivalent conductance of the synapse being caused by an increase in the real conductance of the second device or a decrease in the real conductance of the first device.

In a variant embodiment of the invention, a memristive device has a conductance which varies progressively in a first direction, increasing or decreasing, when the voltage across its terminals is greater than a first predetermined threshold $V_{th+}$, $V_{th-}$ and included in a first amplitude span immediately above said first threshold, varies strongly in a second direction, opposite to the first direction of variation, to attain an extrema when the voltage across its terminals is above a second threshold $V_{th-}$, $V_{th+}$ and included in a second amplitude span immediately above said second threshold, and remains substantially constant when the voltage across its terminals exhibits an amplitude that is lower than the smaller of the two thresholds $V_{th-}$, $V_{th+}$.

In a variant embodiment of the invention:
the amplitude $V_P$ of the pre-synaptic and post-synaptic pulses is configured so as to be lower, in absolute value, than said first threshold $V_{th+}$, $V_{th-}$ and so that twice $2V_P$ its value exceeds said threshold $V_{th+}$, $V_{th-}$ and is situated in the span of voltage values immediately above said threshold $V_{th+}$, $V_{th-}$ which makes it possible to cause a progressive variation, in said first direction of variation, of the conductance of said memristive device, the polarity of a post-synaptic pulse transmitted by an output neuron toward said first memristive device of a synapse is negative if said first direction of variation is an increase and positive if said first direction of variation is a decrease, the polarity of a post-synaptic pulse transmitted by an output neuron toward said second memristive device of a synapse is opposite to that of the pulse transmitted toward said first memristive device, the polarity of a pre-synaptic pulse transmitted by an input neuron is positive to cause an increase in the equivalent conductance of a synapse and negative to cause a decrease in said equivalent conductance.

In a variant embodiment of the invention:

the amplitude $V_P$ of the pre-synaptic and post-synaptic pulses is configured so as to be lower, in absolute value, than said first threshold $V_{th+}$, $V_{th-}$ and so that twice $2V_P$ its value exceeds said threshold $V_{th+}$, $V_{th-}$ and is situated in the span of voltage values immediately above said threshold $V_{th+}$, $V_{th-}$ which makes it possible to cause a progressive variation, in said first direction of variation, of the conductance of said memristive device, the amplitude of a post-synaptic pulse transmitted by an output neuron toward said first memristive device of a synapse if said first direction of variation is an increase or toward said second memristive device of a synapse if said first direction of variation is a decrease, is equal to the amplitude $V_P$ of a pre-synaptic pulse and its polarity is negative, the amplitude of a post-synaptic pulse transmitted by an output neuron of said first memristive device of a synapse if said first direction of variation is a decrease or toward said second memristive device of a synapse if said first direction of variation is an increase, is equal to twice the amplitude $V_P$ of a pre-synaptic pulse and its polarity is positive, the polarity of a pre-synaptic pulse transmitted by an input neuron is positive.

In a variant embodiment, the neural network according to the invention furthermore comprises a feedback control connected at input to each output neuron and at output to each input neuron and suitable for activating at least one input neuron when the current integrated by an output neuron exceeds a predetermined activation threshold, a pre-synaptic pulse being emitted subsequent to the activation of an input neuron.

In a variant embodiment, the neural network according to the invention furthermore comprises a command unit suitable for piloting the set of neurons of said network to carry out a reinitialization of the conductances of said memristive devices of a synapse by executing at least the following steps, for at least one input neuron:

Transmitting an activation pulse to the memristive devices connected to said input neuron, the pulse being configured so as not to modify the conductance of the devices, Propagating said activation pulse toward the output neurons connected downstream of said memristive devices, Measuring, on the basis of the activation pulse received by said output neurons, the conductance of the devices and saving these values, Transmitting, from the output neurons to said memristive devices, a post-synaptic reinitialization pulse of amplitude $V_{RST}$ configured so that on receipt of said pulse, the conductance of said devices is reinitialized to its minimum or maximum value, Transmitting, from the output neurons, a succession of post-synaptic pulses to the device whose measured conductance is the highest if said first direction of variation is an increase or the lowest if said first direction of variation is a decrease, so as to modify its conductance to a value substantially equal to the measured difference between the conductances of the two devices making up a synapse.

In a variant embodiment of the invention, the post-synaptic reinitialization pulse is configured so that its amplitude $V_{RST}$ is greater than said second threshold $V_{th-}$, $V_{th+}$ of said memrisitive devices, its polarity is negative when the pulse is transmitted to said first devices and said first direction of variation is an increase, its polarity is positive when the pulse is transmitted to said second devices and said first direction of variation is an increase, its polarity is positive when the pulse is transmitted to said first devices and said first direction of variation is a decrease, its polarity is negative when the pulse is transmitted to said second devices and said first direction of variation is a decrease, said network furthermore comprises means suitable for provisionally deactivating all the synapses connected to the other input neurons.

In a variant embodiment of the invention, the deactivation of the synapses is carried out by means of field-effect transistors paired with each memristive device, whose drain is connected to the input terminal of said device, whose source is connected to the communicating junction which links said device to said input neuron and whose gate is connected, by way of a deactivation control, to said input neuron.

In a variant embodiment of the invention, said first $V_{th+}$ and second thresholds $V_{th-}$ of said memristive devices satisfy the following inequality $|V_{th+} - V_{th-}| < \min(|V_{th+}|, |V_{th-}|)$, the post-synaptic reinitialization pulse is configured so that:

i. its amplitude $V_{RST}$ is less than said first threshold $V_{th+}$, $V_{th-}$ and that twice its value $2V_{RST}$ is greater than said second threshold $V_{th-}$, $V_{th+}$, ii. its polarity is negative when the pulse is transmitted to said first devices and said first direction of variation is an increase, its polarity is positive when the pulse is transmitted to said second devices and said first direction of variation is an increase, its polarity is positive when the pulse is transmitted to said first devices and said first direction of variation is a decrease, its polarity is negative when the pulse is transmitted to said second devices and said first direction of variation is a decrease, simultaneously, said input neuron emits a pre-synaptic reinitialization pulse consisting of a first negative polarity pulse followed by a second positive polarity pulse, the two pulses having an amplitude equal, in absolute value, to that of the post-synaptic reinitialization pulses.

In a variant embodiment of the invention, to comply with the inequality $|V_{th+} - V_{th-}| < \min(|V_{th+}|, |V_{th-}|)$, said network furthermore comprises a plurality of diodes mounted in series with each artificial synapse and configured so that said first and second thresholds $V_{th+}$, $V_{th-}$ are increased by the threshold voltage of the diode $V_d$.

In a variant embodiment of the invention, the command unit triggers a reinitialization at an estimated instant after which the conductance of a memristive device has attained an extrema.

In a variant embodiment of the invention, the memristive devices are unipolar or bipolar devices.

In a variant embodiment of the invention, the memristive devices are PCM memories.

BRIEF DESCRIPTION OF THE DRAWINGS

Other characteristics and advantages of the invention will become apparent with the aid of the description which follows offered in relation to appended drawings which represent.

DETAILED DESCRIPTION

Figure 1:
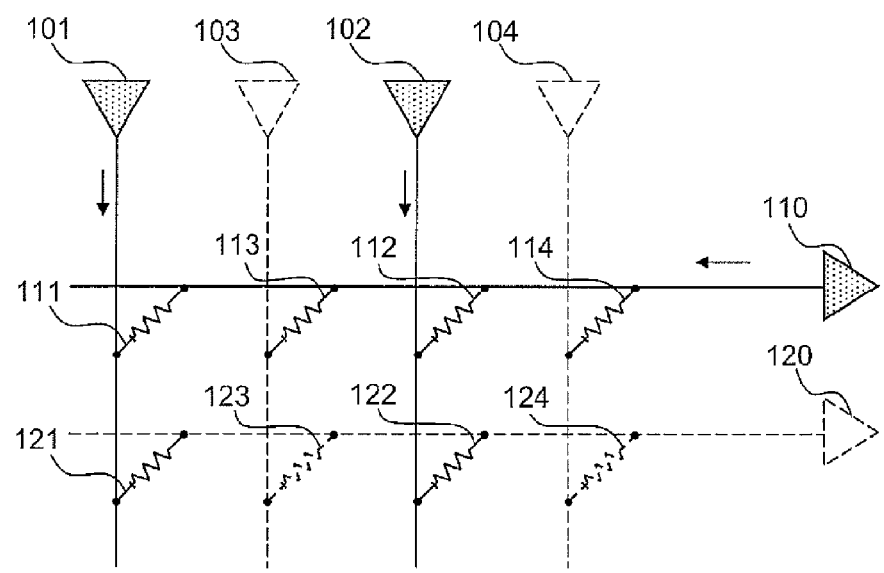
FIG. 1, a functional schematic of an artificial neural network according to the prior art, FIG. 2, a diagram of a practical exemplary embodiment of a matrix of synapses making it possible to produce an artificial neural network, FIG. 3a, an illustration of the learning principle in a neural network by application of a biological STDP rule, FIG. 3b, a chart representing the theoretical variation in the conductance of a synapse according to the biological STDP rule, FIGS. 4a and 4b, two charts representing the variation in conductance of a unipolar memristive device of PCM type as a function of the voltage applied across its terminals, FIG. 4c, a chart representing the variation in conductance of a bipolar memristive device as a function of the voltage applied across its terminals, FIG. 5, a functional schematic of an artificial neural network according to a first embodiment of the invention, FIG. 6, a functional schematic of an artificial neural network according to a second embodiment of the invention, FIG. 7, a functional schematic of an artificial neural network according to a third embodiment of the invention, FIG. 8, a functional schematic of an artificial neural network according to a fourth embodiment of the invention, FIG. 9, an illustration of the reinitialization principle implemented by a neural network according to the third or fourth embodiments of the invention.

FIG. 1 represents a functional schematic of an artificial neural network according to the prior art.

A plurality of input neurons 101,102,103,104 are connected to a plurality of output neurons 110,120 by way of a plurality of artificial synapses 111,112,113,114,121,122,123, 124. An artificial synapse can be produced by means of a memristive device whose conductance varies as a function of the current or of the voltage applied across its terminals. A synapse 111 has one of its terminals connected to an input neuron 101 and the other terminal connected to an output neuron 110. An artificial neuron is an active component which can exhibit the input neuron and/or output neuron functions simultaneously or separately. An artificial neuron is called an input neuron when it is connected downstream to a synapse and is called an output neuron when it is connected upstream to a synapse. Artificial neurons can be active or inactive. In FIG. 1, by way of example, the input neurons 101,102 are considered active and the input neurons 103,104 inactive. Likewise the output neuron 110 is active whereas the output neuron 120 is inactive. A neuron is active when at the instant considered, it emits a pulse. The duration of its "active" state can be predetermined.

Figure 2:
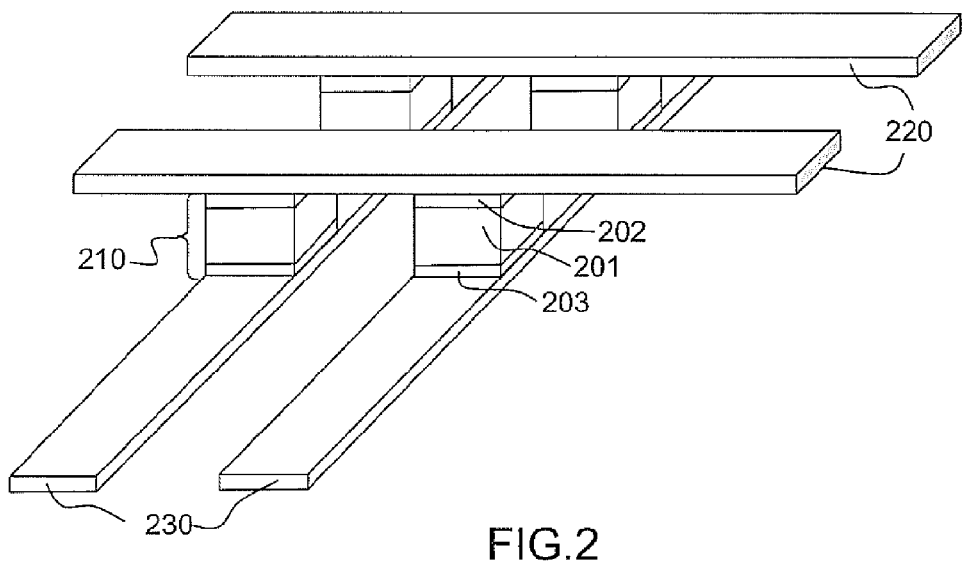

FIG. 2 illustrates on a diagram, a practical exemplary embodiment of the neural network of FIG. 1 using memristive devices.

A memristive device is an electronic component with two terminals which behaves like a resistance or a conductance, the value of which changes dynamically with the application of a current or of a voltage across its terminals. A device of this type can be characterized by the following equations:

$$i = G \cdot v$$

$$\frac{dG}{dt} = f(v, G)$$

where G is the conductance of the device which links its input current i to the voltage across its terminals v.

A family of memristive devices that is particularly suited to the production of artificial synapses in a neural network is that for which the characteristic f(v,G) is nonlinear. Among these families may be cited in particular the devices of MIM (Metal-Insulator-Metal) type which constitute the base cell of several nonvolatile memory technologies such as RRAM "Resistive Random Access Memory" and CBRAM "Conductive-Bridging RAM".

An artificial neural network can be produced, as illustrated in FIG. 2, by using such memristive devices in the guise of artificial synapses and by integrating them into a structure of "crossbar" type. A synapse 210 is produced by an insulant 201, of oxide, solid electrolyte or organic material type, flanked by two electrodes 202,203. One of the electrodes 202 is linked to a first metal layer 220 and the other electrode 203 is linked to a second metal layer 230. The two metal layers 220,230 are arranged so as to form mutually parallel metal strips. A metal strip of one of the two metal layers makes it possible to link an output neuron to a plurality of input neurons by way of a plurality of synapses. Likewise a metal strip of the second layer makes it possible to link an input neuron to a plurality of output neurons by way of a plurality of synapses.

FIG. 2 illustrates a simple example of a practical realization of an artificial neural network. The structure of such a network can be more complex. In particular the two metal layers 220,230 are not necessarily planar and can be take the form of more complex structural realizations while offering the same functionality, namely to realize a communicating junction between the synapses and the neurons.

An artificial neuron is an active component, the modeling of which is inspired by the operation of a biological neuron. Within the framework of the invention, an artificial neuron is a component capable of generating an electrical pulse or "spike" corresponding to an electrical transition of short duration between two distinct states. When a neuron emits a pulse toward a synapse to which it is connected downstream, one speaks of a pre-synaptic pulse. When a neuron emits a pulse toward a synapse to which it is connected upstream, one speaks of a post-synaptic pulse. A pre-synaptic pulse propagates toward the synapses to which the input neuron is connected, its amplitude is optionally modified as a function of the conductance or weight of the synapse and is then propagated up to the output neurons. An output neuron carries out an integration of the input currents or voltages over time. When this integration exceeds a predetermined threshold, the output neuron is activated and then generates a post-synaptic pulse which is retropropagated to the synapses to which it is connected. Furthermore, a leakage current is usually present in the neuron, thus involving a progressive decrease of the integration in the neuron when no signal is applied to its input. A possible but nonlimiting modeling of the operation of a neuron is given by the following differential equation:

$$u + \tau_{leak} \frac{du}{dt} = 0,$$

where u is the integration variable of the neuron (voltage or courant) and $\tau_{leak}$ is a parameter dimensionally equivalent to the duration after which the integration u becomes zero when no signal is produced at the input of the neuron.

The state of the integration variable is updated on receipt of each new pre-synaptic pulse, at an instant $t_{spike}$, by adding the weight w of the pulse, this being manifested by a modeling of the integration variable u in the following form:

$$u = u \cdot \exp\left(-\frac{t_{spike} - t_{last\text{-}spike}}{\tau_{leak}}\right) + w,$$

where $t_{last\text{-}spike}$ and $t_{spike}$ are the instants of reception by the neuron of two successive pre-synaptic pulses.

When the integration variable u exceeds a predetermined threshold, a new post-synaptic pulse is created and transmitted to all the connected synapses. In the case where an output neuron is also an input neuron for other synapses, it also generates a pre-synaptic pulse when its threshold is exceeded. When the pulse or pulses are dispatched, the integration variable u is reset to 0 or to a predetermined initial value.

Other modeling parameters can be taken into account such as the refractory period $T_{refractory}$ during which the integration variable remains at 0 or the lateral inhibition period $T_{inhibition}$ during which all the other neurons are deactivated, that is to say their internal integration mechanism is stopped, when a neuron transmits a pulse. To allow an output neuron to carry out a lateral inhibition, it is appropriate to introduce into the neural network, means of communication between output neurons which are not represented in the diagram of FIG. 1.

The pre and post synaptic pulses dispatched by the input and output neurons toward a synapse will therefore act on the variation of its conductance. In a conventional manner, one speaks of LTD ("Long Term Depression") phases or states to designate an event corresponding to a decrease in the conductance of a synapse subsequent to the transmission of one or more pulses. Likewise the term LTP for "Long Term Potentiation" designates the phases or states corresponding to an increase in the conductance of a synapse.

Figure 3A:
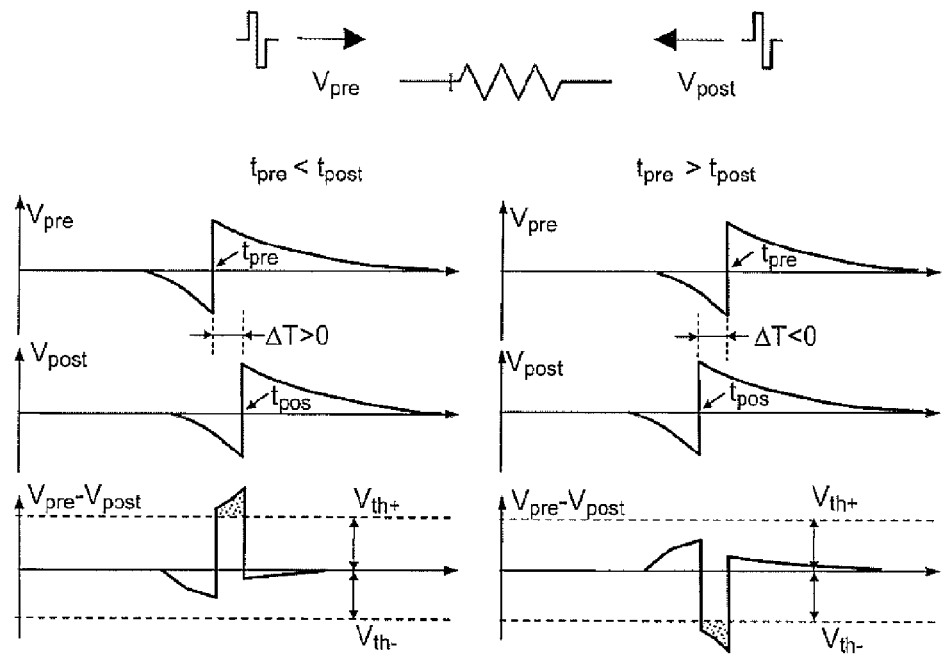

FIG. 3a illustrates, on several voltage-time charts, the LTD and LTP states within the framework of a conventional learning rule of STDP type implemented by a neural network. The principle of the STDP ("Spike Timing Dependent Plasticity") learning rule consists in making the weight of a synapse evolve as a function of the temporal distance between the pre and post-synaptic pulses.

When a pre-synaptic pulse of amplitude +/−$V_{pre}$ is received by a synapse at an instant $t_{pre}$, and a post-synaptic pulse of amplitude +/−$V_{post}$ is received by this same synapse at a subsequent instant $t_{post}$, then the voltage across the terminals of the synapse, which is equal to $V_{pre}-V_{post}$, becomes greater in absolute value than the synapse potentiation threshold $V_{th+}$ for which the conductance will increase. Conversely if the post-synaptic pulse is received by the synapse at an instant prior to the pre-synaptic pulse, in this case the voltage across the terminals of the synapse becomes greater in absolute value than the threshold $V_{th-}$ for which the conductance will decrease.

The LTD state corresponds to the state of depression of the synapse, that is to say a state during which the conductance of the synapse decreases. The LTD phase has a given duration which corresponds to the duration for which the conductance of the synapse decreases. Likewise the LTP state corresponds to the state of potentiation of the synapse and the LTP phase has a given duration corresponding to the duration for which the conductance of the synapse increases. In the case of a conventional STDP learning rule, the variation in the conductance of the synapse depends on the relative instants of arrival of the two pulses.

Figure 3B:
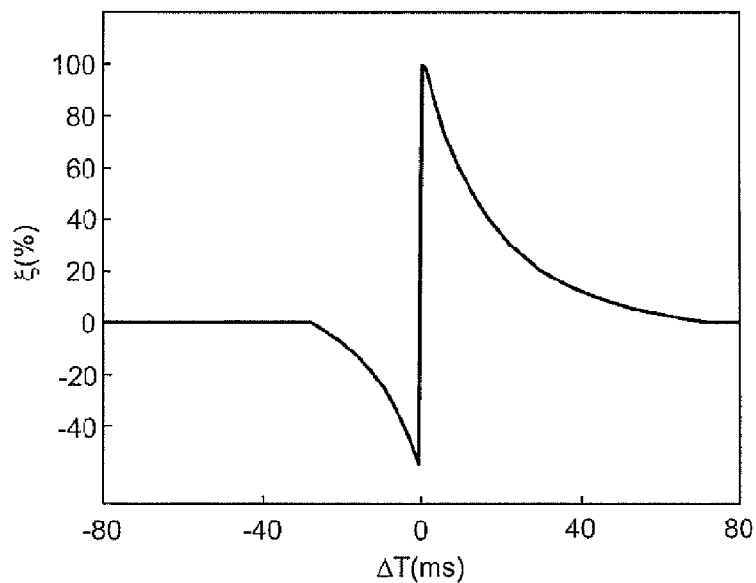

FIG. 3b illustrates, on a chart, the variation 4, expressed as a percentage, of the conductance of a synapse as a function of the temporal gap $\Delta T = t_{pre} - t_{post}$, expressed in ms, between the respective instants of arrival of the pre-synaptic and post-synaptic pulses at the input of the synapse. The curve of FIG. 3b is typical of the STDP biological learning rule.

To obtain correct operation, the conductance of the synapses of an artificial neural network must be able to be increased and decreased progressively without prior knowledge of their conductance. Now, certain types of memristive nano-devices, from the family of PCM ("Phase-Change Memory") memories, do not satisfy this property. Indeed, their conductance may vary progressively, through the application of identical voltage pulses, only in the direction of increase. These technologies are, however, sought-after for the implementation of artificial synapses on account of their integration density and their properties making it possible to carry out calculations directly in the memory.

Figure 4A:
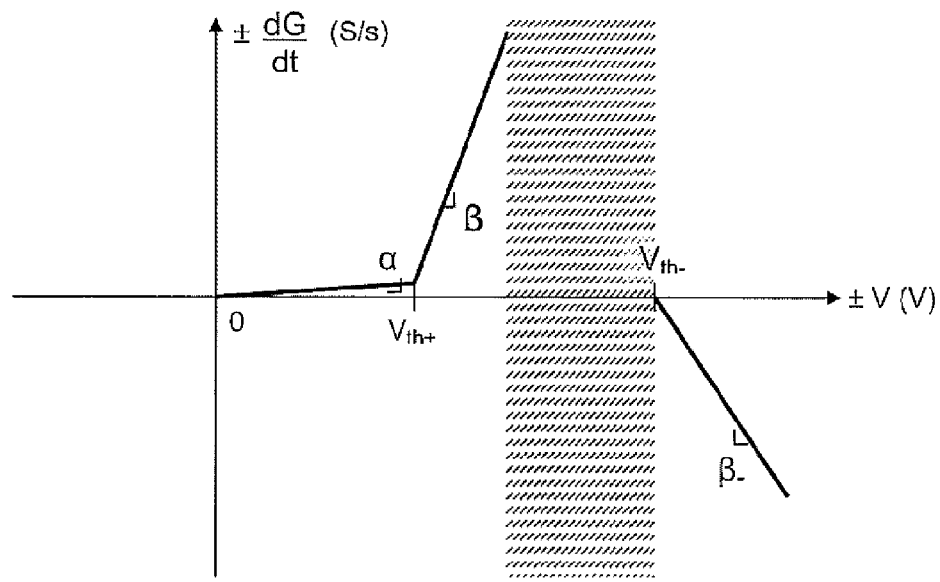
Figure 4B:
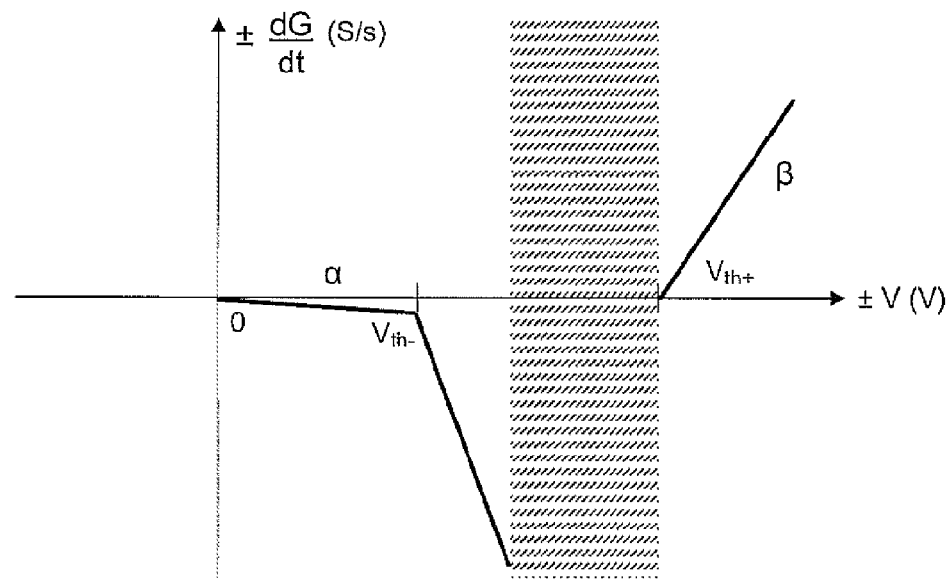

FIGS. 4a and 4b represent, on two charts, the variation in conductance of a unipolar memristive device of PCM type as a function of the voltage applied across its terminals.

FIG. 4a represents a modeling of the 1$^{st}$-order characteristic of a device of PCM type allowing only a progressive potentiation, that is to say an increase, in its conductance with a slope β, when the voltage across its terminals is situated in a given span of values above a threshold voltage $V_{th+}$. For voltages below the potentiation threshold $V_{th+}$, the conductance of the device is substantially constant or increases very slightly with a slope α that is much smaller than β. For voltages above a second depression threshold $V_{th-}$, the conductance decreases abruptly and attains a value which depends only on the voltage level and not on the previous value of the conductance or the duration of the pulse. The non-progressive decrease in the conductance, for this type of device, makes the achieving of an LTD state impossible for a synapse implemented with this PCM device without prior knowledge of the conductance of the device.

FIG. 4b represents a modeling of the 1$^{st}$-order characteristic of a device of PCM type for which the potentiation threshold $V_{th+}$ and the depression threshold $V_{th-}$ are reversed. In this typical case, a voltage situated in a given span of values above the depression threshold $V_{th-}$ makes it possible to abruptly decrease the conductance of the device whereas a voltage situated in a given span of values above the potentiation threshold $V_{th+}$ makes it possible to increase the conductance of the device in a progressive manner.

In a similar manner, not represented, a memory of PCM type can also exhibit a progressive depression only.

Figure 4C:
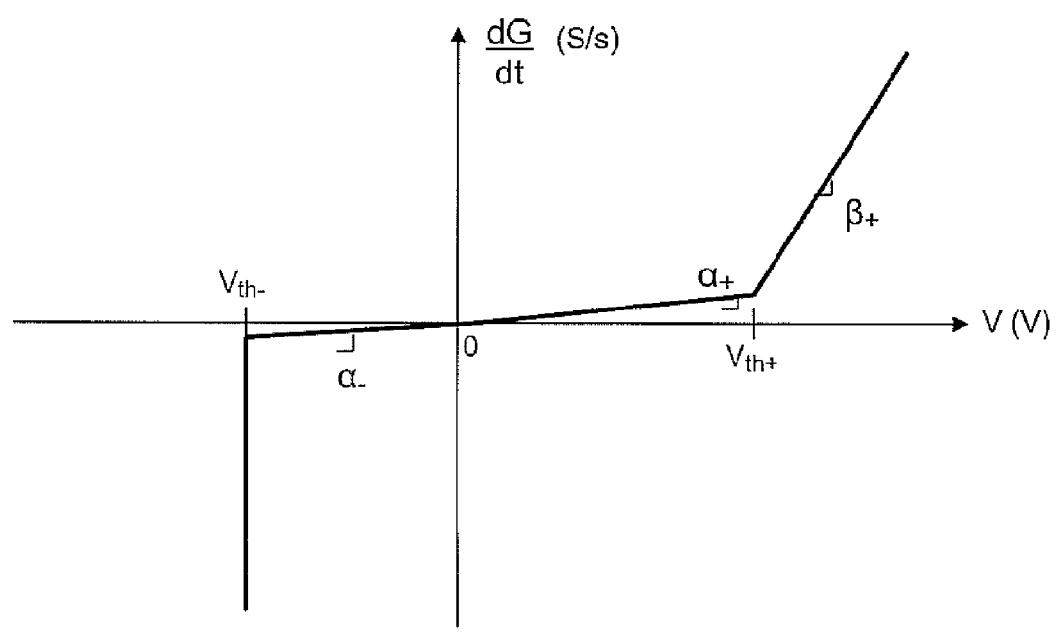

FIG. 4c represents a modeling of the 1$^{st}$-order characteristic of a bipolar memristive device respectively for a potentiation threshold $V_{th+}$ above the depression threshold $V_{th-}$ and vice versa.

In the remainder of the description, the exemplary embodiments of the network according to the invention are limited to the cases of unipolar devices satisfying the properties of FIGS. 4a and 4b. The invention applies in an identical manner for bipolar devices.

By convention, in the examples of FIGS. 4a to 4c, the potentiation threshold $V_{th}+$ is always positive.

The implementation of an unsupervised learning method, for example on the basis of an STDP rule, for an artificial neural network whose synapses are embodied by PCM memories whose properties satisfy those stated hereinabove in support of FIGS. 4a and 4b, is therefore not trivial since it requires an alternating behavior of depression or potentiation of the synapses.

Figure 5:
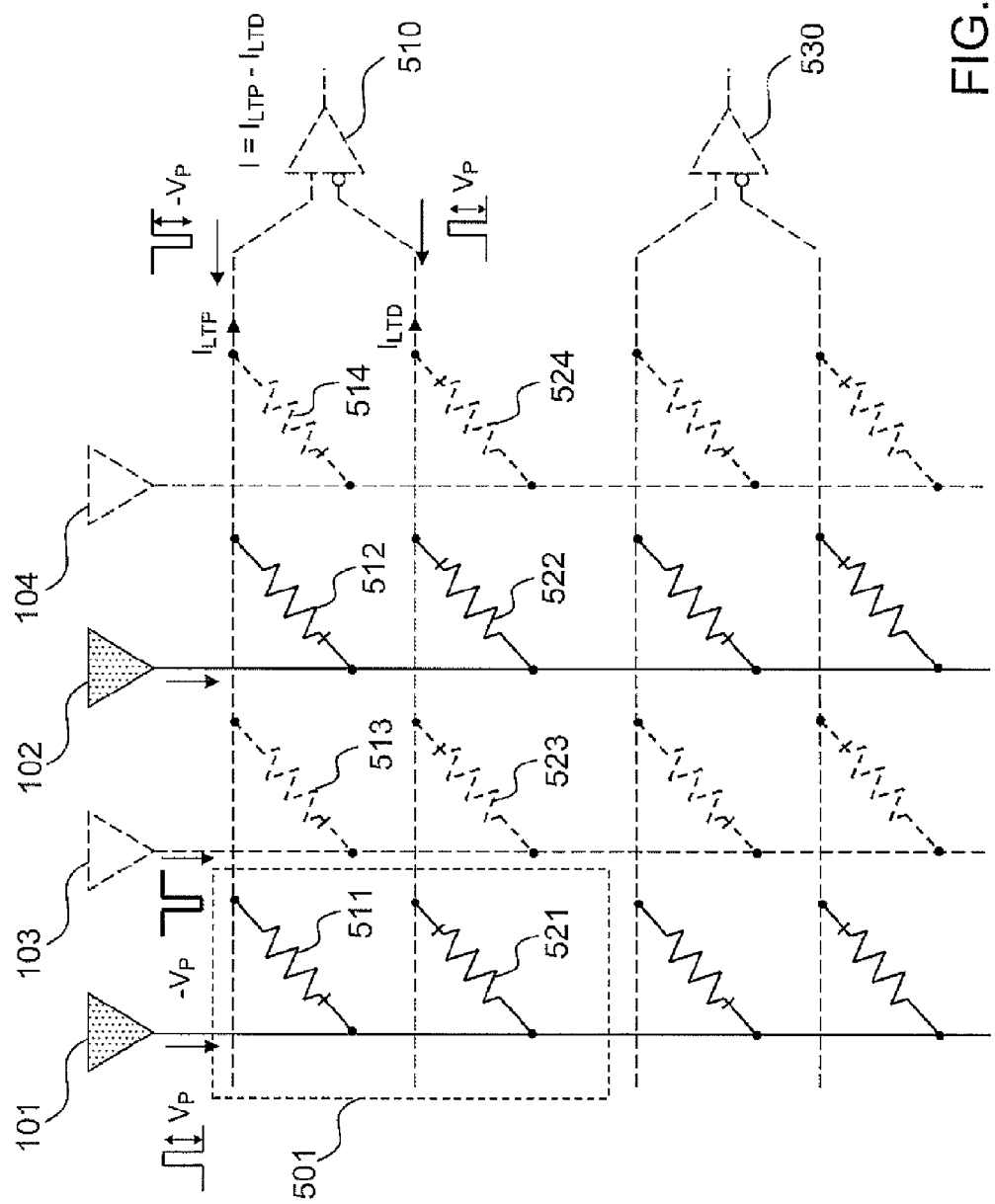

In order to alleviate this problem, the present invention proposes a neural network suited to the use of PCM memories functionally described in FIG. 5.

The output neurons 510,530 comprise, in contradistinction to those of the network of the prior art, two input terminals which make it possible to link them to two series of memristive devices 511,512,513,514,521,522,523,524. Each device is moreover connected, at its input, to an input neuron 101, 102,103,104. Each input neuron 101 and output neuron 510 pair is thus interconnected with the aid of two memristive devices 511,521 which together form an artificial synapse 501. One of the devices 511 constituting the synapse 501 is designated LTP device since its function is to contribute to a global increase in the conductance of the synapse 501; the other device 521 is designated LTD device since its function is to contribute to a global decrease in the conductance of the synapse 501. The memristive devices are preferably memories of PCM type but can also be bipolar or unipolar memristive devices of CBRAM or RRAM type. In each synapse 501, the LTP 511 and LTD 521 devices are mounted in opposition, that is to say if one is mounted in the forward direction, the other is mounted in the reverse direction. The input terminal of a neural network 510 linked to an LTD device 521 is complemented. Thus, an output neuron 510 integrates the difference $I_{LTP}-I_{LTD}$ between the currents originating from the LTP devices and those originating from the LTD devices.

The architecture of the neural network according to the invention makes it possible to carry out a learning method with alternation of LTP and LTD states and to do so despite the impossibility of achieving a relative progressive decrease in the conductance of a PCM device. Indeed, the global increase or decrease in the synapse 501 is obtained on the basis of solely an increase in the conductance of one of the two memristive devices of which it is composed.

Indeed, a synapse 501 is in an LTP state when its global conductance increases, this being manifested by an increase in the conductance of the LTP device and indirectly an increase in the intensity of the current $I_{LTP}$ which will contribute to activating the output neuron 510. Conversely, a synapse 501 is in an LTD state when its global conductance decreases, this being manifested by an increase in the conductance of the LTD device and indirectly an increase in the intensity of the current $I_{LTD}$ and this will contribute to decreasing the current globally integrated by the output neuron 510. The global or equivalent conductance of a synapse 501 can be modeled as being equal to the difference of the conductances of the corresponding LTP device 511 and LTD device 521.

The neural network according to the invention, described in FIG. 5, makes it possible to implement an unsupervised learning method based on the succession of potentiation (LTP state) or depression (LTD state) of an artificial synapse.

In the case of a learning rule of STDP type, the LTP state of a synapse is obtained through the temporal overlapping of a post-synaptic pulse which succeeds a pre-synaptic pulse. Conversely the LTD state is obtained through the temporal overlapping of a post-synaptic pulse which precedes a pre-synaptic pulse.

To implement such a rule with synapses produced by PCM memories whose characteristics can be modeled by the curve of FIG. 4a, that is to say for memristive devices whose conductance can only increase, the neurons of the network behave in the following manner.

The following paragraph, associated with FIG. 5, describes an exemplary embodiment corresponding to the use of unipolar memristive devices whose characteristic is of the type of that of FIG. 4a, that is to say for which the potentiation threshold is less than the depression threshold.

The input neurons 101,102, which are active and in an LTP state, transmit, to the synapses 511,521,512,522 to which they are connected, a pre-synaptic pulse of predetermined amplitude $V_P$ and of positive polarity. The amplitude $V_P$ is configured so that it is lower, in absolute value, than the potentiation threshold $V_{th+}$ of a memristive device but that twice its value $2V_P$ is greater than said threshold $V_{th+}$, lower than the depression threshold $V_{th-}$ of the device and situated in the span of voltage values immediately above the threshold $V_{th+}$ which makes it possible to increase the conductance of the memristive device. This pulse alone does not induce any change in the conductance of the synapses which receive it. It is thereafter propagated to the output neurons 510 connected to said synapses which integrate the difference of currents originating from the LTP devices and LTD devices.

When an output neuron 510 is activated, it generates a post-synaptic pulse of the same amplitude $V_p$ and of negative polarity. The pulse is retro-propagated to the LTP memristive devices 511,512,513,514 connected to the first input of the output neuron 510. Simultaneously, a pulse of like amplitude but of reversed polarity, therefore positive, is generated on the second complemented input of the output neuron 510 and retro-propagated to the LTD memristive devices 521,522, 523,524 to which it is connected.

The temporal overlapping of the pre and post synaptic pulses induces, across the terminals of the LTP devices 511, 512, a voltage equal to twice the amplitude $V_P$ of a pulse, the consequence of which is thus to increase the conductance of the LTP devices 511,512. Indeed, the voltage across the terminals of an LTP device is equal to $V_{pre}-V_{post}$ where $V_{pre}$ is the voltage recorded on the terminal connected to the input neuron and $V_{post}$ the voltage recorded on the terminal connected to the output neuron. When the two pulses meet up at the level of the LTP device, the voltage across its terminals becomes equal to $2V_P$.

Conversely, the post-synaptic pulse, of positive amplitude, transmitted to the LTD devices 521,522, vanishes when it encounters the pre-synaptic pulse of the same amplitude and of identical polarity, the effect of which is not to modify the conductance of the LTD devices 521,522.

Thus, the global conductance of the synapse 501 increases.

A depression of the synapses 501 is obtained in a similar manner, on replacing the pre-synaptic pulse emitted by an active input neuron 103,104 in an LTD state, by a pulse of amplitude $V_p$ and of negative polarity. Thus the temporal overlapping of the pre and post synaptic pulses induces an increase in the conductance of the LTD devices 523,524 and does not modify that of the LTP devices 513,514. Indeed, an LTD device being mounted in the reverse direction to an LTP device, the voltage across the terminals of an LTD device is equal to $V_{post}-V_{pre}$ where $V_{pre}$ is the voltage recorded on the terminal connected to the input neuron and $V_{post}$ the voltage recorded on the terminal connected to the output neuron. When the two pulses meet up at the level of the LTD device, the voltage across its terminals becomes equal to $2V_P$.

When the memristive devices used exhibit solely a property of decrease in their conductance, the STDP learning rule described hereinabove applies in the same manner on reversing the polarity of the post-synaptic pulses transmitted by an output neuron 510,530 to the LTD and LTP devices or on reversing the role of the LTD and LTP devices.

Figure 6:
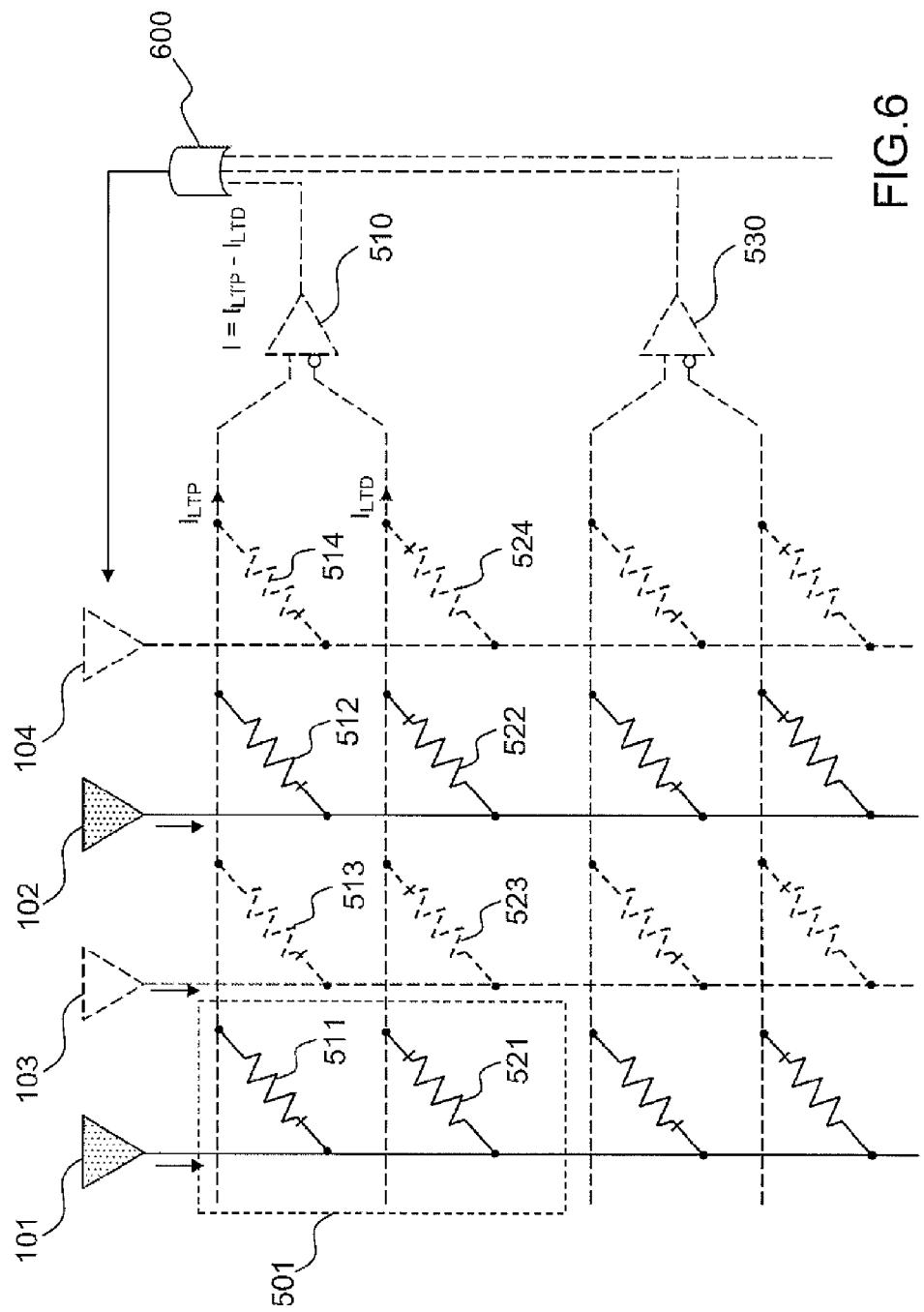

In a variant embodiment of the neural network according to the invention, described in FIG. 6, all the output neurons 510,530 are furthermore linked to the set of input neurons 101,102,103,104 for example by way of an OR logic gate 600 which produces as output an active signal if at least one of its inputs is active. The role of this feedback control is to inform each input neuron of the activation of an output neuron. Any means equivalent to the OR logic gate 600 and carrying out the same function with a view to the same result can be substituted for it without departing from the scope of the invention.

The feedback control 600 makes it possible to slightly modify the behavior of the input neurons. To activate an output neuron, the pulses generated by the input neurons can be of lower amplitude than the amplitude $V_P$ configured to interact with a post-synaptic pulse with the aim of modifying the conductance of a synapse. It is then possible to distinguish an activation pulse, of arbitrary amplitude less than $V_P$, from the pre-synaptic pulse which is generated only when an output neuron exceeds its integration threshold, is activated and transmits this information by means of the feedback control 600.

The neural network according to the invention, such as described in FIGS. 5 and 6, also makes it possible to implement unsupervised learning methods which are not based on the STDP biological rule.

For an STDP rule, the depression of the synapses (LTD state) is obtained by the interaction between a post-synaptic pulse transmitted by an output neuron and a specific pre-synaptic pulse transmitted by an input neuron in an LTD state. This specific pre-synaptic pulse differs from the pre-synaptic pulse transmitted by this same input neuron when it is in an LTP state and when the objective aimed at is the potentiation of the synapse.

Another learning rule can consist in using just a single type of pre-synaptic pulse, able to engender a potentiation of the synapses and systematically apply a depression (LTD state) to the synapses which receive only a post-synaptic pulse.

To implement this rule, the configuration of the post-synaptic pulses is modified as follows. When an output neuron is activated, it transmits to the LTP devices to which it is connected, a pulse of amplitude $V_P$ equal, in absolute value, to that of the pre-synaptic pulse but of opposite polarity. The amplitude $V_P$ is configured so that it does not exceed, in absolute value, the potentiation threshold $V_{th+}$ of an LTP or LTD memristive device.

The post-synaptic pulse transmitted to the LTD devices is, for its part, configured such that its polarity is positive and that its amplitude is equal to twice the amplitude $V_P$ of the pre-synaptic pulse so as to exceed the potentiation threshold $V_{th+}$ of said memristive devices without exceeding their depression threshold $V_{th-}$ and so as to be situated in the span of voltage values immediately above the threshold $V_{th+}$ which makes it possible to increase the conductance of the memristive device.

Thus, when an LTP device 511 simultaneously receives a pre-synaptic pulse, of amplitude $V_P$ and of positive polarity and a post-synaptic pulse, of amplitude $V_P$ and of negative polarity, the voltage across its terminals becomes equal to $2V_P$ and the conductance of the LTP device increases.

Simultaneously, the associated LTD device 521 will exhibit a voltage across its terminals equal to $2V_P - V_P = V_P$, which does not make it possible to trigger a potentiation of said device. The LTD device 521 therefore sees its conductance unchanged, and the synapse 501 sees its global conductance increase.

Moreover, when the input neuron 103,104 has emitted no pre-synaptic pulse and the synapses to which it is connected are impacted solely by a post-synaptic pulse, they undergo a decrease in their global conductance. Indeed, the LTP device 513 attained by a post-synaptic pulse of amplitude $V_P$ will see its conductance unmodified whereas the LTD device 523 will exhibit a voltage across its terminals equal to $2V_P$ and therefore will see its conductance decreased. It follows from this that the global conductance of the synapse is decreased.

The neural network according to the invention, such as described in FIGS. 5 and 6 for the case of unipolar memristive devices of the type of those characterized in FIG. 4a, is implemented in a similar manner for the case of unipolar memristive devices of the type of those characterized in FIG. 4b, except for the following difference.

In the case where the potentiation threshold $V_{th+}$ of a memristive device is greater than its depression threshold $V_{th-}$ (case of FIG. 4b), the amplitude $V_P$ of the pre-synaptic pulse is configured in such a way that it is lower, in absolute value, than the potentiation threshold $V_{th+}$ of a memristive device, that twice its value $2V_P$ is greater than said threshold $V_{th+}$ and that it is greater than the depression threshold $V_{th-}$ without being situated in the span of voltage values making it possible to decrease the conductance of the device.

The neural network according to the invention also applies in respect of bipolar memristive devices.

A particular embodiment of the invention which relates to the reinitialization of the conductances of the memristive devices of the network according to the invention is now described. This embodiment is described for the case of unipolar PCM devices complying with the characteristic of FIG. 4a. In a manner analogous to the main embodiment of the invention, the cases of FIGS. 4b and 4c as well as the cases for which the memristive devices exhibit only a progressive depression of their conductance and not a progressive increase are readily deduced.

As described previously, the memristive devices used to embody the artificial synapses of the neural network have the particular feature of allowing a progressive variation in conductance only in a single direction. The LTP and LTD states of the synapses are obtained by acting on the difference between the conductances of the two memristive devices of which they consist. Thus, in the case where a synapse is frequently potentiated or depreciated, the conductance of its LTP and/or LTD devices can attain a maximum $G_{max}$ or minimum $G_{min}$ ceiling value. When such a value is attained, the unsupervised learning methods described previously can no longer operate correctly. In such a case, it is necessary to be able to reinitialize the conductance of the synapse.

Figure 7:
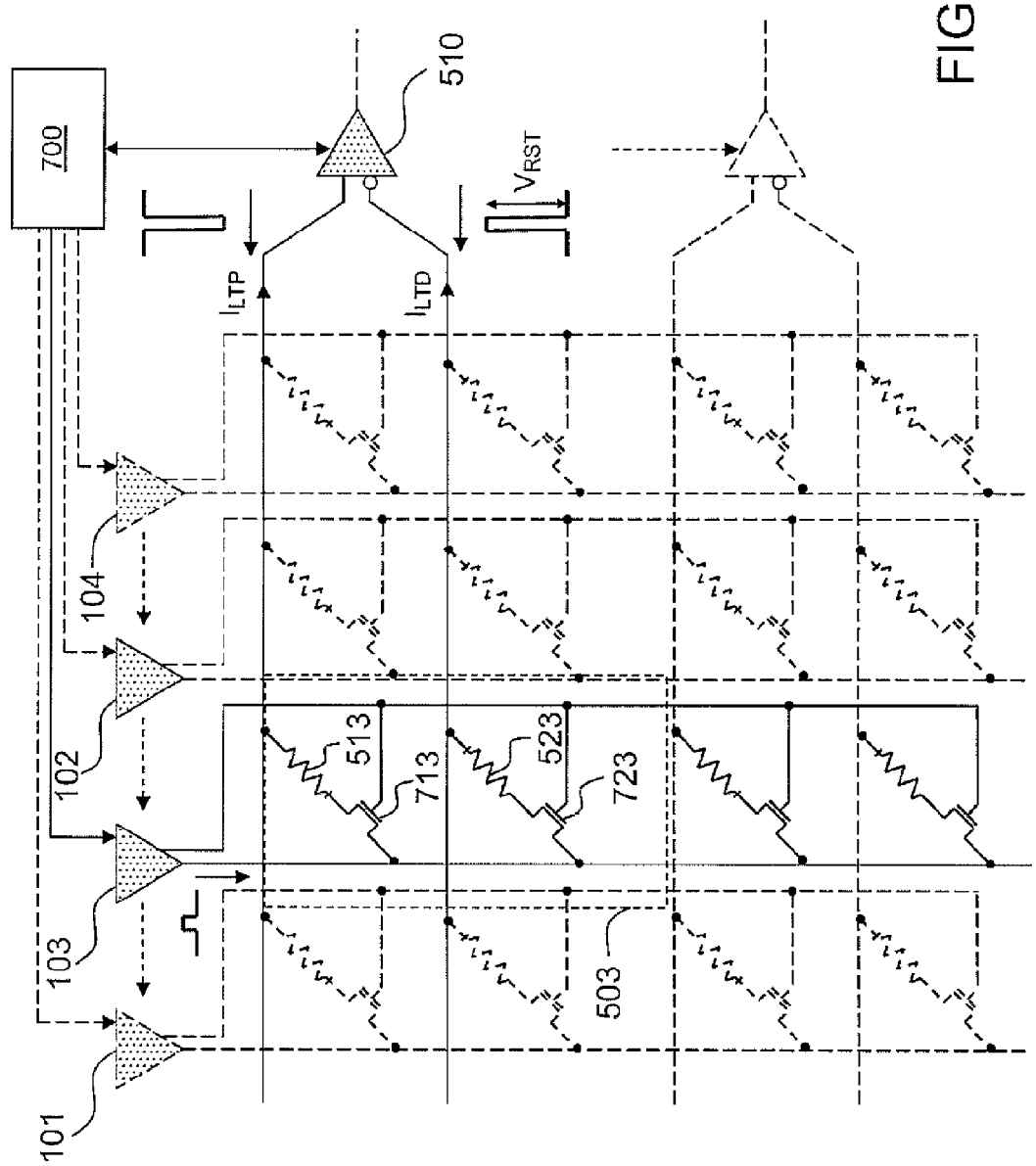

For this purpose, the neural network according to the invention furthermore comprises, such as is described in FIG. 7, a command unit 700 suitable for communicating with the set of networks of input neurons 101,102,103,104 and output neurons 510,530 and for implementing the reinitialization procedure comprising the following steps.

At a predetermined instant after which a reinitialization is deemed necessary, the command unit 700 selects one of the input neurons 101, beginning with the first, and deactivates all the synapses connected to the other input neurons 102,103, 104. Such a deactivation is, for example, carried out by means of field-effect transistors 713,723 paired with each memristive device 513,523. The drain of a transistor 713 is connected to the input terminal of the device 513, its source is connected to the communicating junction which links the device 513 to an input neuron 103 and its gate is connected, by way of a deactivation control, to the input neuron 103. Thus, when an input neuron 103 is selected by the command unit 700, only the synapses to which it is connected can be activated.

The selected input neuron 103 thereafter transmits an activation pulse to the pre-synaptic terminals of the LTP 513 and LTD 523 devices of the synapses 503. This pulse is configured so as not to modify the conductance of the devices that it passes through and is propagated up to the output neurons 510.

The command unit 700 communicates with the output neuron 510 so as to measure, on the basis of the pulse received, the global conductance of the synapse 503 which is equal to the difference of the conductances of the LTP 513 and LTD 523 devices. This measurement is saved by the command unit.

A reinitialization pulse is thereafter transmitted, by the output neuron 510, to the LTP 513 and LTD 523 devices to which it is connected. This pulse is configured so that its amplitude $V_{RST}$ exceeds, in absolute value, the depression threshold $V_{th-}$ of the LTP and LTD devices. In an analogous manner, if the LTP and LTD devices exhibit only a progressive depression and not a progressive potentiation, the amplitude $V_{RST}$ is configured so as not to exceed, in absolute value, the potentiation threshold $V_{th+}$. The pulse transmitted to the LTP device is of negative polarity whereas the pulse transmitted to the LTD device is of positive polarity relative to $V_{RST}$. Thus, when the synapse 503 simultaneously receives the two reinitialization pulses, the conductance of the two devices is reset to its minimum value. Only the synapse 503 connected to the input neuron 103 selected by the unit 700 being active, the other synapses which receive a post-synaptic pulse do not see their conductance be modified.

Finally, a succession of post-synaptic pulses is transmitted, by the output neuron 510, to that one of the LTP 513 or LTD 523 devices whose conductance measured before the reinitialization was the highest. The post-synaptic pulses transmitted are configured so that the conductance of the LTP 513 or LTD 523 device is increased to attain the global conductance value stored by the command unit 700.

The steps implemented to reinitialize a synapse are repeated for each input neuron, each time all the synapses connected to the other input neurons are deactivated.

Figure 9:
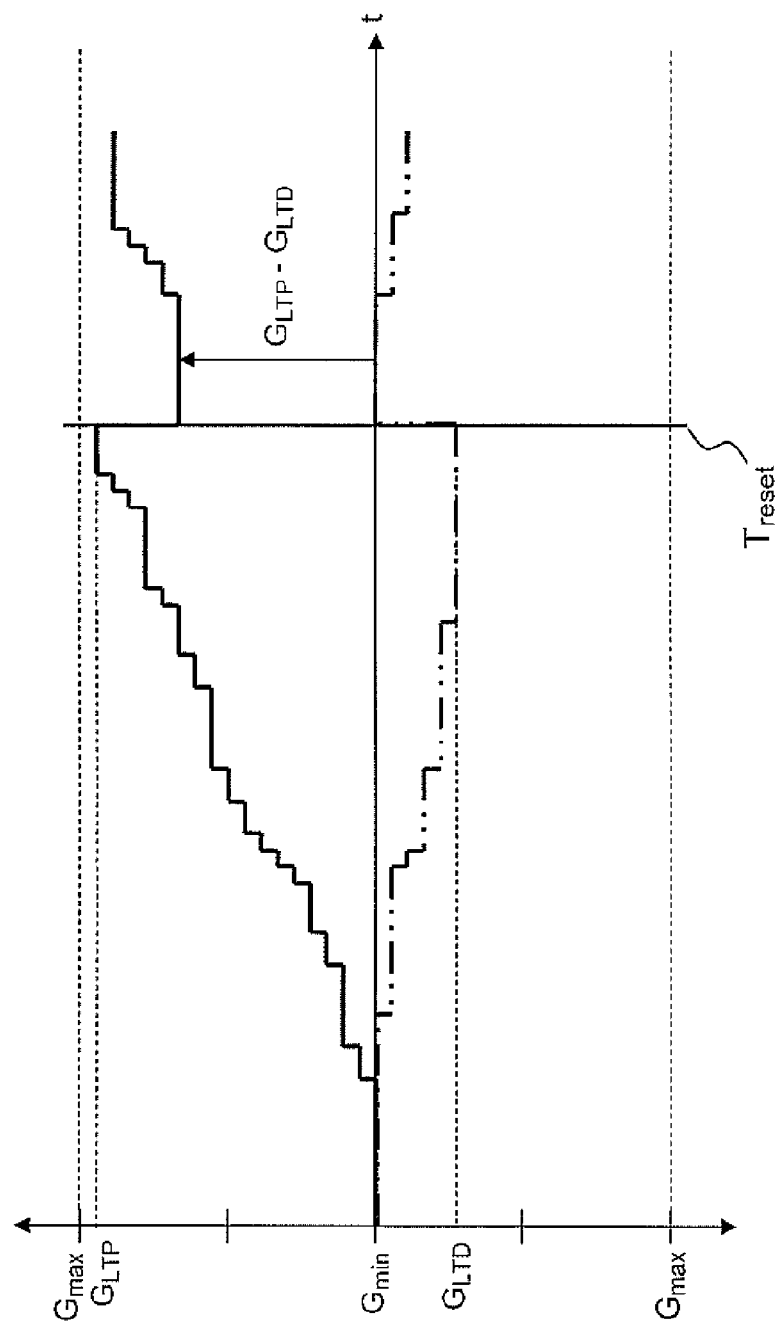

FIG. 9 represents on a chart the evolution of the conductance of the LTP 513 and LTD 523 devices. At an instant $T_{reset}$, the conductance $G_{LTP}$ of the LTP device having attained a value close to the maximum value $G_{max}$, a reinitialization is triggered. The conductances $G_{LTP}$ and $G_{LTD}$ of the two devices are firstly reset to their minimum value $G_{min}$ and then the conductance of the LTP device 513 is increased until it attains a value equal to the difference $G_{LTP}-G_{LTD}$ of the two previously stored conductances.

In another example (not described), if the conductance $G_{LTD}$ of the LTD device attains a value close to its maximum value before the LTP device, then it is the conductance of the LTD device which is increased until it attains a value equal to the difference $G_{LTD}-G_{LTP}$ of the two conductances.

In the case where the LTD and LTP devices exhibit only a progressive depression and not a progressive potentiation, the conductances of the two devices are reinitialized to their maximum value $G_{max}$ and then the conductance of the device whose conductance was the lowest is decreased until it attains a value equal to the difference of the two previously stored conductances.

The instant of triggering of a reinitialization can be determined in various ways. In particular, it can be predetermined so as to estimate the time after which the conductance of a memristive device will attain its maximum value. For example, a reinitialization can be triggered after a given number N of activations of an output neuron. This number N being determined as being the mean number of pulses making it possible to cause the conductance of a device to evolve toward its maximum value. A reinitialization can also be triggered after a predetermined duration corresponding to the duration required to carry out N activations of an output neuron.

In a variant embodiment of the invention, if the difference $G_{LTP}-G_{LTD}$ is less than a predetermined threshold, the LTP device and the LTD device are reinitialized as indicated previously, in the converse case only the conductance of the device, out of the LTP device and the LTD device, exhibiting the lowest conductance at the moment of reinitialization, is reset to its minimum value.

Figure 8:
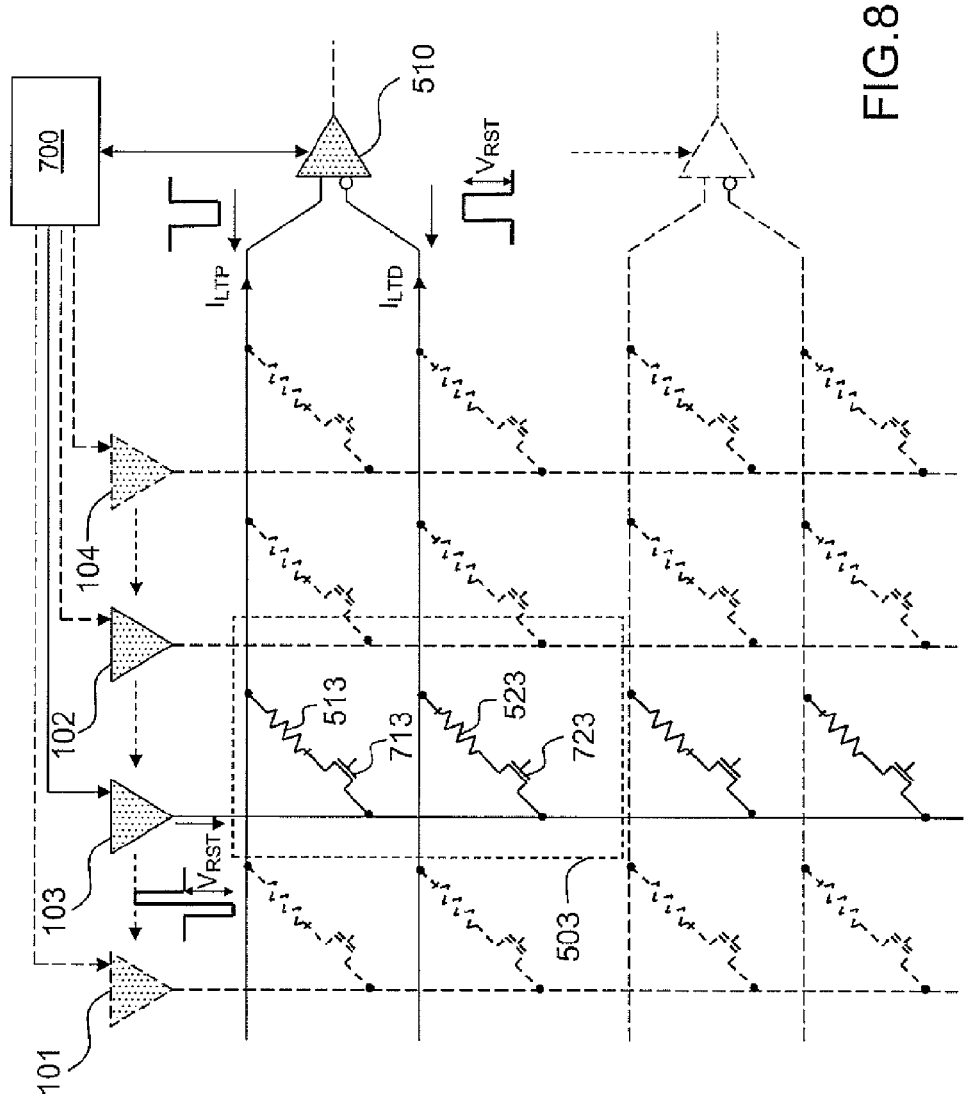

In another variant embodiment of the invention, described in FIG. 8, the deactivation of all the synapses connected to an input neuron which is not selected by the command unit 700 is rendered optional. This variant is applicable to memristive devices which satisfy the following inequality:

$$|V_{th+}-V_{th-}|<\min(|V_{th+}|,|V_{th-}|),$$

where min designates the minimum function. In a typical case such as this, it is possible to configure the amplitude $V_{RST}$ of the reinitialization pulse so that it is below the potentiation threshold $V_{th+}$ and that twice its value is above the depression threshold $V_{th-}$.

The reinitialization procedure implemented by the command unit 700 is then modified as follows. Simultaneously with the emission of a post-synaptic reinitialization pulse, an input neuron 103 selected by the unit 700 transmits a pre-synaptic reinitialization pulse to the synapses 503 to which it is connected upstream. This pulse consists of a first pulse of negative polarity followed by a second pulse of positive polarity, the two pulses having an amplitude equal, in absolute value, to that of the post-synaptic reinitialization pulses.

Thus, a device receiving solely a reinitialization pulse originating from an input neuron or from an output neuron will not be affected, its conductance will not be modified. Conversely, the simultaneous reception of a pre-synaptic reinitialization pulse and of a post-synaptic reinitialization pulse ensures, through the temporal overlapping of the two pulses, that a voltage equal to twice the amplitude $V_{RST}$ is applied to the input of the memristive device concerned, and this will cause its conductance to be reset to its minimum value $G_{min}$.

The reinitialization of the set of synapses connected to one and the same input neuron can be carried out simultaneously, this exhibiting the advantage of requiring only a single activation pulse (case of FIG. 7) or a single pre-synaptic reinitialization pulse.

In a variant embodiment of the invention, not shown diagrammatically, the field-effect transistors used for the purposes of deactivating the memristive devices to which they are connected can be dispensed with and replaced with a diode mounted in series with each memristive device and configured so as to comply with the inequality $|V_{th+}-V_{th-}|<\min(|V_{th+}|,|V_{th-}|)$. If $V_D$ is the threshold voltage of the diode, the activation thresholds $V_{th+},V_{th-}$ of the device are increased by this voltage $V_D$ and the inequality to be complied with becomes $|V_{th+}-V_{th-}|<\min(|V_{th+}|,|V_{th-}|)+V_D$, this being less constraining. The diode is mounted so as to be biased in the forward direction for all the effective voltages passing through the device. If this mounting is not possible, a bidirectional diode can also be used.

The neural network according to the invention can also be utilized within a so-called multi-layer network which comprises several neuronal structures in series. The output neurons of a layer constitute the input neurons of the next layer. Such an architecture makes it possible to improve learning performance.

The neural network according to the invention makes it possible to implement the unsupervised learning methods described previously. These methods find their application notably in the following fields:
- the extraction and the classification of temporally correlated sequences, such as trajectories of mobile objects, within video data,
- the extraction and the classification of temporally correlated sequences, such as sounds, syllables or words, within audio data,
- the recognition of shapes within image or video data,
  - the extraction and the classification of molecules or chemical agents within biological data produced by chemical sensors.

The invention claimed is:

1. A neural network comprising a plurality of artificial input neurons, a plurality of artificial output neurons and a plurality of artificial synapses, each input neuron being connected to each output neuron by way of an artificial synapse, wherein each output neuron comprises a first input and a second input, the second input being inverted compared to the first input, and each synapse comprises a first memristive device connected to the first input of an output neuron and further comprises a second memristive device, mounted in opposition to said first memristive device, and connected to the second input of said output neuron, so that said output neuron integrates a difference between currents originating from the first and second devices.

2. The neural network of claim 1, wherein said memristive devices are configured to receive a pre-synaptic pulse emitted by the input neuron to which they are connected upstream or a post-synaptic pulse emitted by the output neuron to which they are connected downstream, said pulses configured to cause an increase, a decrease or a stagnation in an equivalent conductance of the synapse comprising said devices, an increase in the equivalent conductance of the synapse being caused by an increase in a real conductance of the first device or a decrease in a real conductance of the second device and a decrease in the equivalent conductance of the synapse being caused by an increase in the real conductance of the second device or a decrease in the real conductance of the first device.

3. The neural network of claim 2, wherein a memristive device has a conductance which varies progressively in a first direction, increasing or decreasing, when a voltage across its terminals is greater than a first predetermined threshold $V_{th+}$, $V_{th-}$ and included in a first amplitude span immediately above said first threshold, varies strongly in a second direction, opposite to the first direction of variation, to attain an extrema when the voltage across its terminals is above a second threshold $V_{th-}$, $V_{th+}$ and included in a second amplitude span immediately above said second threshold, and remains substantially constant when the voltage across its terminals exhibits an amplitude that is lower than the smaller of the first predetermined threshold $V_{th-}$, $V_{th+}$ and the second threshold $V_{th-}$, $V_{th+}$.

4. The neural network of claim 3, wherein:
- an amplitude $V_P$ of the pre-synaptic and post-synaptic pulses is configured so as to be lower, in absolute value, than said first predetermined threshold $V_{th+}$, $V_{th-}$ and so that twice $2V_P$ its value exceeds said first predetermined threshold $V_{th+}$, $V_{th-}$ and is situated in a span of voltage values immediately above said first predetermined threshold $V_{th+}$, $V_{th-}$ which makes it possible to cause a progressive variation, in said first direction of variation, of the conductance of said memristive device,
- a polarity of a post-synaptic pulse transmitted by an output neuron toward said first memristive device of a synapse is negative if said first direction of variation is an increase and positive if said first direction of variation is a decrease,
- the polarity of a post-synaptic pulse transmitted by an output neuron toward said second memristive device of a synapse is opposite to that of the pulse transmitted toward said first memristive device, and
- a polarity of a pre-synaptic pulse transmitted by an input neuron is positive to cause an increase in an equivalent conductance of a synapse and negative to cause a decrease in said equivalent conductance.

5. The neural network of claim 3, wherein:
- an amplitude $V_P$ of the pre-synaptic and post-synaptic pulses is configured so as to be lower, in absolute value, than said first predetermined threshold $V_{th+}$, $V_{th-}$ and so that twice $2V_P$ its value exceeds said first predetermined threshold $V_{th+}$, $V_{th-}$ and is situated in a span of voltage values immediately above said first predetermined threshold $V_{th+}$, $V_{th-}$ which makes it possible to cause a progressive variation, in said first direction of variation, of the conductance of said memristive device,
- the amplitude of a post-synaptic pulse transmitted by an output neuron toward said first memristive device of a synapse if said first direction of variation is an increase or toward said second memristive device of a synapse if said first direction of variation is a decrease, is equal to the amplitude $V_P$ of a pre-synaptic pulse and its polarity is negative,
- the amplitude of a post-synaptic pulse transmitted by an output neuron of said first memristive device of a synapse if said first direction of variation is a decrease or toward said second memristive device of a synapse if said first direction of variation is an increase, is equal to twice the amplitude $V_P$ of a pre-synaptic pulse and its polarity is positive, and
- the polarity of a pre-synaptic pulse transmitted by an input neuron is positive.

6. The neural network of claim 3, furthermore comprising a feedback control connected at an input to each output neuron and at an output to each input neuron and configured to activate at least one input neuron when a current integrated by an output neuron exceeds a predetermined activation threshold, a pre-synaptic pulse being emitted subsequent to the activation of an input neuron.

7. The neural network of claim 3, furthermore comprising a command unit configured to pilot a set of neurons of said network to reinitialize the conductances of said memristive devices of a synapse by executing at least the following steps, for at least one input neuron:
- transmitting an activation pulse to the memristive devices connected to said input neuron, the activation pulse being configured to not modify the conductance of the memristive devices,
- propagating said activation pulse toward the output neurons connected downstream of said memristive devices, measuring, based on the activation pulse received by said output neurons, the conductance of the memristive devices and saving these values, transmitting, from the output neurons to said memristive devices, a post-synaptic reinitialization pulse of amplitude $V_{RST}$ configured so that on receipt of said post-synaptic reinitialization pulse, the conductance of said memristive devices is reinitialized to its minimum or maximum value, transmitting, from the output neurons, a succession of post-synaptic pulses to the memristive device whose measured conductance is the highest if said first direction of variation is an increase or the lowest if said first direction of variation is a decrease, so as to modify its conductance to a value substantially equal to a measured difference between the conductances of the memristive devices making up a synapse.

8. The neural network of claim 7, wherein:

the post-synaptic reinitialization pulse is configured so that its amplitude $V_{RST}$ is greater than said second threshold $V_{th-}$, $V_{th+}$ of said memrisitive devices, its polarity is negative when the post-synaptic reinitialization pulse is transmitted to a first memrisitive device and said first direction of variation is an increase, its polarity is positive when the post-synaptic reinitialization pulse is transmitted to a second memrisitive device and said first direction of variation is an increase, its polarity is positive when the post-synaptic reinitialization pulse is transmitted to said first memrisitive device and said first direction of variation is a decrease, its polarity is negative when the post-synaptic reinitialization pulse is transmitted to said second memrisitive device and said first direction of variation is a decrease, and said network furthermore comprising means configured for provisionally deactivating all the synapses connected to the other input neurons.

9. The neural network of claim 8, wherein the deactivation of the synapses is carried out by means of field-effect transistors paired with each memristive device, whose drain is connected to an input terminal of said memristive device, whose source is connected to a communicating junction which links said memristive device to said input neuron and whose gate is connected, by way of a deactivation control, to said input neuron.

10. The neural network of claim 7, wherein:

said first $V_{th+}$ and second thresholds $V_{th-}$ of said memristive devices satisfy the following inequality $|V_{th+}-V_{th-}|<\min(|V_{th+}|,|V_{th-}|)$, the post-synaptic reinitialization pulse is configured so that:
  its amplitude $V_{RST}$ is less than said first threshold $V_{th+}$, $V_{th-}$ and that twice its value $2V_{RST}$ is greater than said second threshold $V_{th-}$, $V_{th+}$,
  its polarity is negative when the post-synaptic reinitialization pulse is transmitted to said first memristive device and said first direction of variation is an increase, its polarity is positive when the post-synaptic reinitialization pulse is transmitted to said second memristive device and said first direction of variation is an increase, its polarity is positive when the post-synaptic reinitialization pulse is transmitted to said first memristive device and said first direction of variation is a decrease, its polarity is negative when the post-synaptic reinitialization pulse is transmitted to said second memristive device and said first direction of variation is a decrease, and simultaneously, said input neuron emits a pre-synaptic reinitialization pulse consisting of a first negative polarity pulse followed by a second positive polarity pulse, the two pulses having an amplitude equal, in absolute value, to that of the post-synaptic reinitialization pulses.

11. The neural network of claim 10, wherein, to comply with the inequality $|V_{th+}-V_{th-}|<\min(|V_{th+}|,|V_{th-}|)$, said network furthermore comprises a plurality of diodes mounted in series with each artificial synapse and configured so that said first predetermined threshold and said second threshold $V_{th+}$, $V_{th-}$ are increased by a threshold voltage of one of the plurality of diodes $V_d$.

12. The neural network of claim 7, wherein the command unit triggers a reinitialization at an estimated instant after which the conductance of a memristive device has attained an extrema.

13. The neural network of claim 1, wherein the memristive devices are unipolar or bipolar devices.

14. The neural network of claim 1, wherein the memristive devices are PCM memories.

* * * * *